United States Patent
Chang et al.

(10) Patent No.: US 11,031,533 B2
(45) Date of Patent: Jun. 8, 2021

(54) LIGHT-EMITTING DEVICE, LIGHT-EMITTING MODULE, AND BACKLIGHT MODULE

(71) Applicant: Darwin Precisions Corporation, Hsinchu County (TW)

(72) Inventors: Yu-Cheng Chang, Hsinchu County (TW); Yu-Ming Huang, Hsinchu County (TW); Ya-Han Ko, Hsinchu County (TW)

(73) Assignee: DARWIN PRECISIONS CORPORATION, Hsinchu County (TW)

( * ) Notice: Subject to any disclaimer, the term of this patent is extended or adjusted under 35 U.S.C. 154(b) by 0 days.

(21) Appl. No.: 16/733,611

(22) Filed: Jan. 3, 2020

(65) Prior Publication Data
US 2021/0066556 A1 Mar. 4, 2021

(30) Foreign Application Priority Data
Aug. 30, 2019 (TW) .................... 108131424

(51) Int. Cl.
| | |
|---|---|
| *H01L 33/58* | (2010.01) |
| *H01L 33/60* | (2010.01) |
| *H01L 25/075* | (2006.01) |
| *H01L 33/54* | (2010.01) |

(52) U.S. Cl.
CPC .......... *H01L 33/60* (2013.01); *H01L 25/0753* (2013.01); *H01L 33/54* (2013.01); *H01L 2933/0058* (2013.01)

(58) Field of Classification Search
CPC ..... H01L 33/60; H01L 33/58; H01L 25/0753; H01L 2933/0058
See application file for complete search history.

(56) References Cited

U.S. PATENT DOCUMENTS

| | | | |
|---|---|---|---|
| 2007/0147073 A1 | 6/2007 | Sakai et al. | |
| 2008/0137335 A1* | 6/2008 | Tsai .................... | G02B 5/0247 362/247 |
| 2011/0051043 A1* | 3/2011 | Kim ................... | G02F 1/133308 349/64 |
| 2013/0229808 A1 | 9/2013 | Wang et al. | |
| 2015/0009453 A1* | 1/2015 | Cha ................... | G02F 1/133603 349/65 |
| 2019/0103527 A1 | 4/2019 | Hsieh | |

FOREIGN PATENT DOCUMENTS

| | | |
|---|---|---|
| CN | 1667466 A | 9/2005 |
| CN | 107505769 A | 12/2017 |
| JP | 2007048489 A | 2/2007 |
| TW | 201823781 A | 7/2018 |

* cited by examiner

*Primary Examiner* — Feifei Yeung Lopez
(74) *Attorney, Agent, or Firm* — WPAT, PC

(57) ABSTRACT

A light-emitting device including a light-emitting unit and a second lens is provided. The second lens includes light-emitting surface, bottom surface, side surfaces and accommodation hole. The bottom surface is disposed opposite to the light-emitting surface, and the side surfaces are respectively connected to the light-emitting surface and the bottom surface. The accommodation hole passes through the second lens and accommodates light-emitting unit. A light-emitting module and a backlight module are also provided.

14 Claims, 9 Drawing Sheets

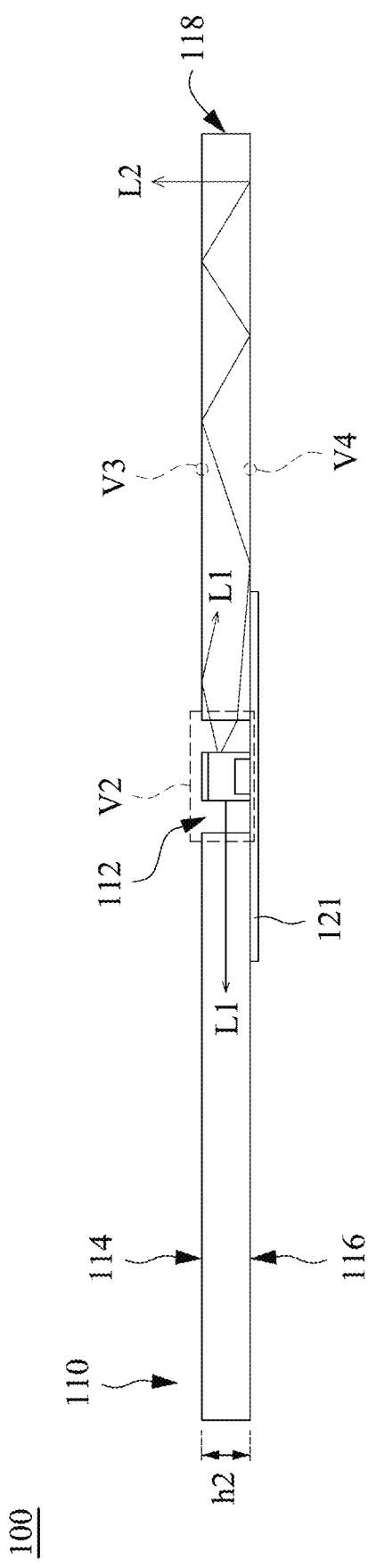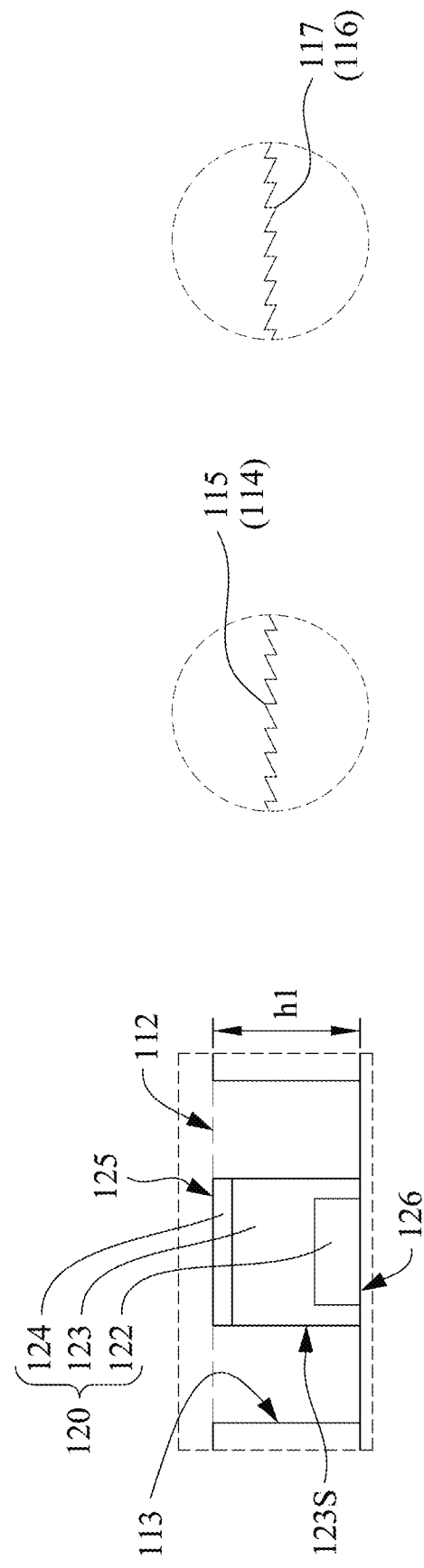

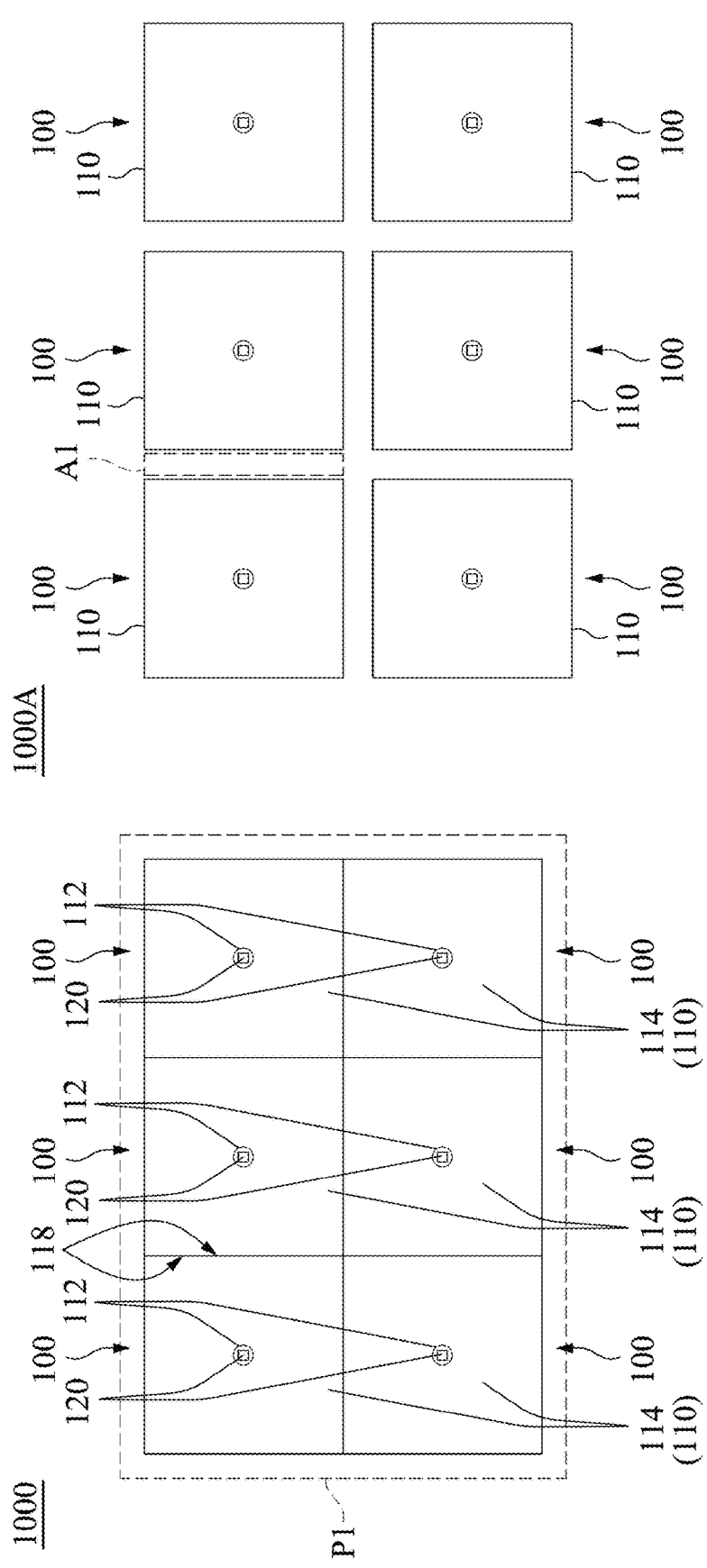
Fig. 2A
Fig. 2B
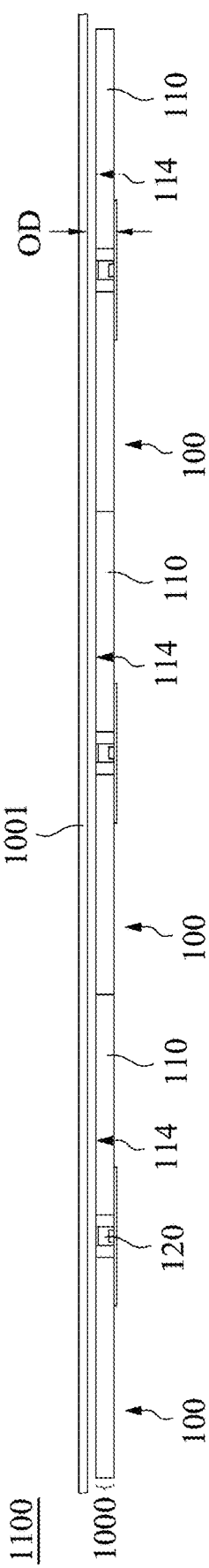
Fig. 2C

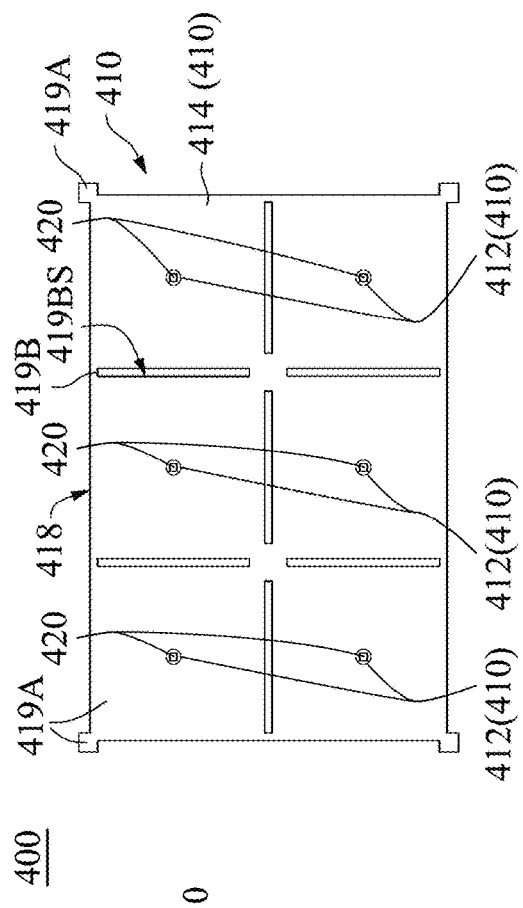
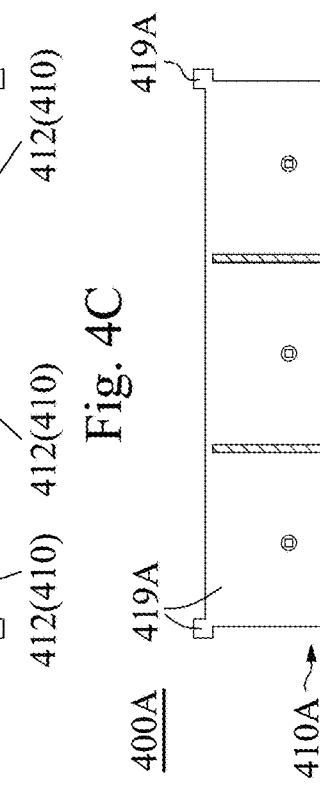
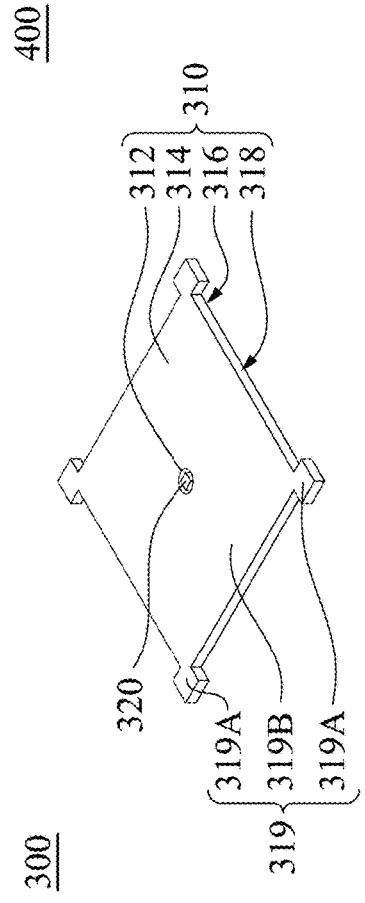
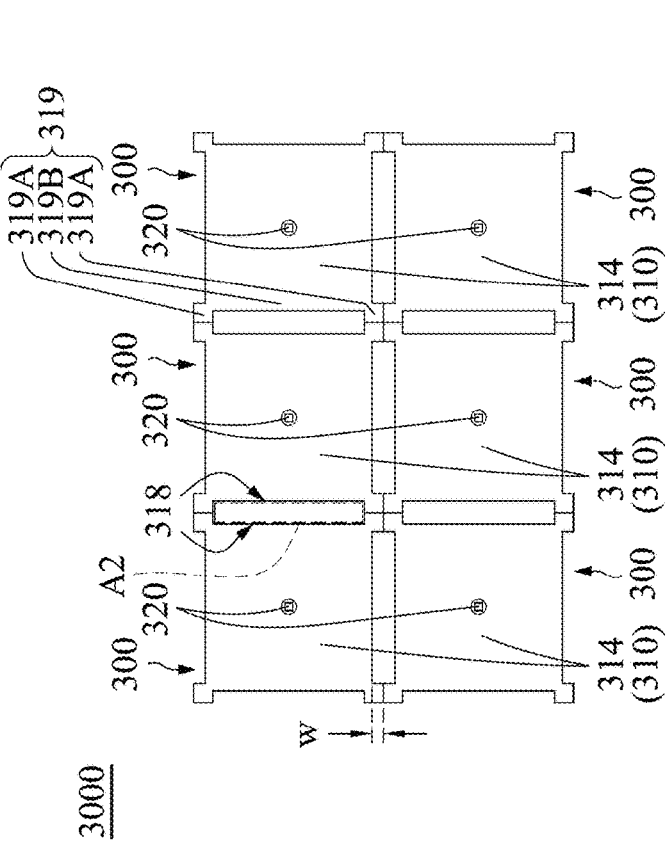
Fig. 4A
Fig. 4B
Fig. 4C
Fig. 4D

LIGHT-EMITTING DEVICE, LIGHT-EMITTING MODULE, AND BACKLIGHT MODULE

CROSS-REFERENCE TO RELATED APPLICATION

This application claims priority to Taiwan Application Serial Number 108131424, filed Aug. 30, 2019, which is herein incorporated by reference in its entirety.

BACKGROUND

Field of Disclosure

The present disclosure relates to an optical apparatus, optical device and optical system. More particularly, the present disclosure relates to a light-emitting device, light-emitting module, and backlight module.

Description of Related Art

Among existing flat displays, liquid crystal modules need surface light sources provided by a backlight module to enable a liquid crystal display (LCD) to display an image. Modern existing backlight modules can be divided into edge-lite backlight modules and direct backlight modules. The direct backlight module provides surface light sources with more uniform luminance as well as providing a local-dimming function, so that the direct backlight module has been applied widely to display used in home and work place. The direct backlight module has been further applied to advanced LCDs with the local illumination adjustment technology, and an advanced LCD can enhance the image contrast to the image contrast of organic light-emitting diode (OLED) display, which is one of the current development trends of modern LCDs.

However, in the direct backlight module used by the liquid crystal module, a light-emitting device such as a light-emitting diode (LED) needs to be distributed behind liquid crystal panel. The direct backlight module of the existing technology further disposes lenses between the light-emitting diode and the liquid crystal panel, and an extra diffusion space, thus the size of the display is difficult to reduce. In other words, since the direct backlight module needs a longer optical distance (OD), plus the volume of the light-emitting device and lens, the thickness of the display is unable to be reduced. Therefore, how to further maintain uniformity of the surface light source and reduce the thickness of display at time is still one of the problems that need to be solved for a person having ordinary skill in the art.

SUMMARY

It is to be understood that both the foregoing general description and the following detailed description are by examples, and are intended to provide further explanation of the invention as claimed.

An embodiment of the present disclosure provides a light-emitting device including a light-emitting unit and a second lens. The second lens includes light-emitting surface, bottom surface, side surfaces and accommodation hole. The bottom surface is disposed opposite to the light-emitting surface, and the side surfaces are respectively connected to the light-emitting surface and the bottom surface. The accommodation hole passes through the second lens and accommodates light-emitting unit.

An embodiment of the present disclosure provides a light-emitting module, including the light-emitting devices, and the light-emitting surfaces of the second lenses of the light-emitting devices are substantially coplanar.

An embodiment of the present disclosure provides a backlight module including the light-emitting module and an optical film. The optical film is disposed on the light-emitting surfaces of the second lenses of the light-emitting devices, and the optical film is configured to receive illumination light provided by the light-emitting devices.

As seen above, the light-emitting device provided by embodiments of the present disclosure can reduce the thickness of the light-emitting device and provide uniform light source by disposing the light-emitting unit in the accommodation hole of the second lens. The light-emitting module and the backlight module including the light-emitting devices can also meet the needs of thinning.

BRIEF DESCRIPTION OF THE DRAWINGS

The invention can be more fully understood by reading the following detailed description of the embodiment, with reference made to the accompanying drawings as follows:

FIG. 1C is the schematic sectional view according to cutting-plane line 11 of FIG. 1A;

FIG. 1D is the schematic partial magnified view according to area V2 of FIG. 1C;

FIG. 1E is the schematic partial magnified view according to area V3 of FIG. 1C;

FIG. 1F is the schematic partial magnified view according to area V4 of FIG. 1C;

FIG. 2A is the top view of light-emitting module in the first embodiment of the present disclosure;

FIG. 2B is the top view of light-emitting module of other embodiments of the present disclosure;

FIG. 2C is the sectional view of backlight module of the first embodiment of the present disclosure;

FIG. 4A is the schematic perspective view of light-emitting device of the third embodiment of the present disclosure;

FIG. 4B is the top view of light-emitting module of the third embodiment of the present disclosure;

FIG. 4C is the top view of light-emitting device of the fourth embodiment of the present disclosure;

FIG. 4D is the top view of light-emitting device of other embodiments of the present disclosure;

DETAILED DESCRIPTION

Figure 1A:
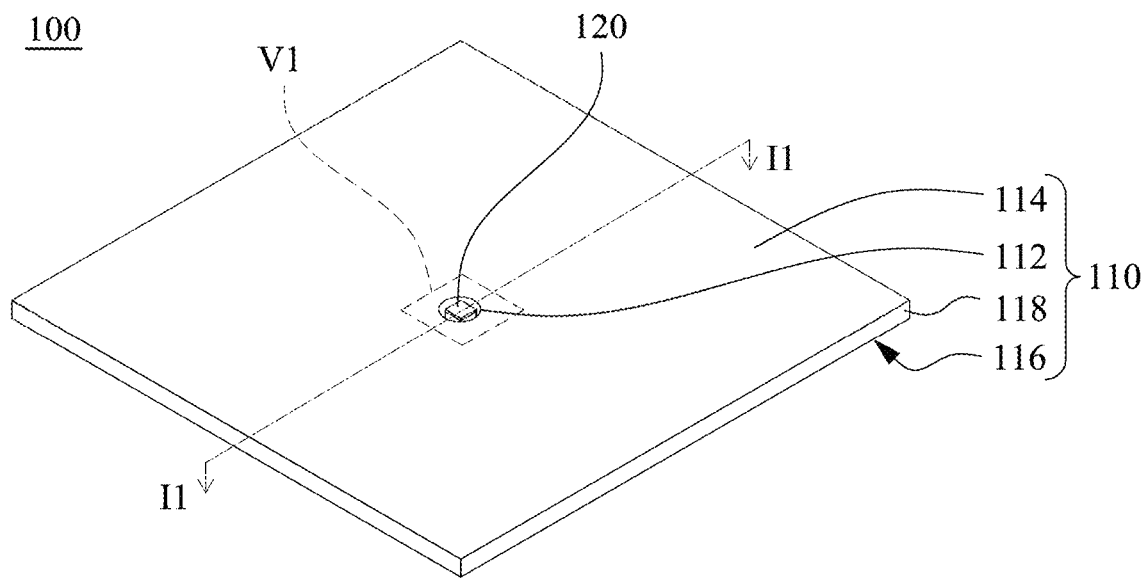
FIG. 1A is the schematic perspective view of light-emitting device in the first embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

Light-emitting devices, light-emitting modules and backlight modules provided by embodiments of the present disclosure can be applied to display. For instance, the light-emitting device, light-emitting module and backlight module provided by embodiments of the present disclosure are suitable to be applied to liquid crystal displays (LCD), televisions or other flat displays, but the present disclosure is not limited thereto.

Although the terms first, second, etc. may be used herein to describe various elements, components, or parts, but these elements, components, or parts should not be limited by these terms. The terms are used to differentiate one device, component or part from others. Thus, "the first device", "the first component" or "the first unit" can also be called "the second device", "the second component" or "the second unit" without departing from the guidance herein.

In the attached figures, the thickness of layers, films, panels, regions and etc, are exaggerated for the sake of clarity. Throughout the specification, the same reference numerals indicate the same components. It will be understood that, when a component such as a layer, a film, a region or a substrate are referred to as being "on" or "connected" to another component, it can be directly on or connected to another component, or intermediate components may also be present. On the contrary, when components are referred to as being "directly on another component" or "directly connected to" another component, no intermediate component existed. "Connect" as used in the text can be referred to physical and/or electrical connection. Moreover, other components may exist between the "electrically connected" or "coupling" components.

Furthermore, the light-emitting device and light-emitting module provided by an embodiment of the present disclosure can apply to backlight module, which can be the backlight module in thin display. FIG. 1A is the schematic perspective view according to the light-emitting device in the first embodiment of the present disclosure. Please refer to FIG. 1A, in the first embodiment of the present disclosure, light-emitting device 100 includes second lens 110 and light-emitting unit 120, and the second lens 110 has an accommodation hole 112, and the accommodation hole 112 accommodates light-emitting unit 120.

In the embodiment of the present disclosure, the light-emitting unit 120 can be solid-state light source such as light-emitting diode (LED). To be specific, the light-emitting unit 120 can be, for instance, solid-state light source whose side direction light intensity is greater than forward direction light intensity. The side direction light is the light emitted from side surfaces of the light-emitting unit 120, and the forward direction light is the light emitted from top surface of the light-emitting unit 120. The following description will further refer to sectional view to specify the devices.

Please refer to FIG. 1A, the second lens 110 of the first embodiment of the present disclosure includes light-emitting surface 114, bottom surface 116 being disposed opposite to the light-emitting surface 114, side surfaces 118 and the accommodation hole 112. Each of the side surfaces 118 connects the light-emitting surface 114 to the bottom surface 116, and the side surfaces 118 are substantially facing outward. The material of the second lens 110 of the embodiment, for instance, can include polycarbonate (PC) or poly (methyl methacrylate, PMMA), but the present disclosure is not limited thereto. The material of second lens in other embodiments can include other light-transmitting materials to meet the needs.

In the embodiment of the present disclosure, the accommodation hole 112 passes through the second lens 110 and accommodates light-emitting unit 120 within. To be specific, in the second lens 110 of the embodiment, the accommodation hole 112 passes through the bottom surface 116 and the light-emitting surface 114, allowing the opening on the light-emitting surface 114 to connect the opening on the bottom surface 116. Together, please refer to FIG. 1B, which is the schematic partial magnified view according to area V1 of FIG. 1A. In the embodiment, inner wall 113 of the accommodation hole 112 and the side surfaces 118 are substantially inner and outer surfaces being disposed opposite to each other in the second lens 110. That is, in the second lens 110 of the embodiment, the side surfaces 118 are substantially facing backward and surrounding the accommodation hole 112.

The accommodation hole 112 provides space for light-emitting unit 120, and in the embodiment of the present disclosure, the inner wall 113 of the accommodation hole 112 surrounds the light-emitting unit 120, so that the light emitted from the side surface of the light-emitting unit 120 can efficiently enter the second lens 110 through the inner wall 113 of the accommodation hole 112, so as to emit from the light-emitting surface 114.

Since the light-emitting device 100 of the embodiment of the present disclosure has the accommodation hole 112 passed through the second lens 110, the second lens 110 and the light-emitting unit 120 can be disposed in the light-emitting device 100 in a coplanar manner, and the overall thickness of the light-emitting device 100 will not be further increased by the thickness of the second lens 110. On the other hand, the second lens 110 and the light-emitting unit 120 provide proper optical coupling, and the inner wall 113 of the accommodation hole 112 can be the light-receiving surface for the second lens 110 for the light-emitting unit 120, thus the second lens 110 corresponding to the light-emitting unit 120 can provide a more proper optical coupling.

On the other hand, in the first embodiment of the present disclosure, the second lens 110 can include first structures 115. The first structures 115 are disposed on the light-emitting surface 114, in order to enhance the light-emitting efficiency when the second lens 110 receiving the light emitted from the light-emitting unit 120.

To be specific, in a comparative example, the light-emitting diode used in the direct backlight module has to configure with a solid lens to disperse normal direction light. The solid lens has to cover the light-emitting diode, and the height of the space to accommodate the light-emitting diode has to be 2 to 3 times higher than the height of the light-emitting diode. Therefore, the optical distance (OD) of the backlight module in the comparative example has to be over 5 millimeter, so that the thickness of the backlight module cannot be reduced.

On the contrary, the light-emitting unit 120 of the light-emitting device 100 in the first embodiment of the present disclosure can be disposed in the accommodation hole 112 of the second lens 110, so as to further reduce the thickness. The following will refer to the sectional view of the embodiment to specify further.

FIG. 1C is the sectional view of the first embodiment of the present disclosure taken along cutting-plane line 11 in FIG. 1A. To be explicit, please refer to FIG. 1C, in the embodiment, the light-emitting surface 114 and the bottom surface 116 of the second lens 110 are disposed opposite to each other, and the accommodation hole 112 passes through the light-emitting surface 114 and the bottom surface 116. Thus, the light-emitting unit 120 can be disposed in the accommodation hole 112 from the side of the bottom surface 116 of the second lens 110.

For instance, the light-emitting unit 120 of the embodiment of the present disclosure can be, for example, disposed on a substrate 121. After the light-emitting unit 120 moved into the accommodation hole 112, the substrate 121 will be located on a side of the second lens 110 which is adjacent to the bottom surface 116, providing a simple method of assembling the light-emitting device 100. However, the substrate 121 and the light-emitting unit 120 are used to exemplify a method of assembling light-emitting unit 120, and the embodiment of the present disclosure is not limited to the method of assembling the light-emitting unit 120 and substrate 121.

Please refer to FIG. 1D, which is the schematic partial magnified view according to area V2 in FIG. 1C. The light-emitting unit 120 of the embodiment of the present disclosure further includes light-emitting chip 122, an encapsulation 123 and first shading layer 124. The encapsulation 123 is covering the light-emitting chip 122, and the first shading layer 124 is disposed on the encapsulation 123. In other words, in the light-emitting unit 120 of the embodiment, the encapsulation 123 is located between the first shading layer 124 and the light-emitting chip 122.

The light-emitting chip 122 of the embodiment of the present disclosure can include, for example, light-emitting diode such as flip chip light-emitting diode, but the present disclosure is not limited thereto, in other embodiments, other kind of solid-state light source can be included to meet the needs.

The encapsulation 123 of the embodiment of the present disclosure, for example, can include light-transmitting resin and phosphor, where the phosphor is configured to provide function of wavelength conversion, but the present disclosure is not limited thereto.

The first shading layer 124 of the embodiment of the present disclosure is configured to absorb or reflect the light from the light-emitting chip 122 can be, for example, white layer with light transmittance less than 15%, but the present disclosure is not limited thereto. In other embodiments, the first shading layer 124 can include haze layer, distributed Bragg reflector (DBR) or microstructure for reducing transmittance. The following will refer to other drawings to further specify the light-emitting unit 120 of the embodiment of the present disclosure.

In the light-emitting unit 120 of the embodiment of the present disclosure, the encapsulation 123 can transmit the light emitted from the light-emitting chip 122. Part of the light transmitted by the encapsulation 123 can be emitted directly, other part will reach the first shading layer 124, and the first shading layer 124 will absorb the part of light or reflect the part of light back to the encapsulation 123. In the embodiment, the first shading layer 124 is located in the top area of the light-emitting unit 120, the part of light transmitted by encapsulation 123 can be emitted directly from the side area of the light-emitting unit 120, thus the intensity of the light emitted from the side area can be higher than that of the light emitted from the top area.

The encapsulation 123 of the embodiment of the present disclosure is in the form of a cube with, for instance, four side surfaces 123S which are facing respectively toward the inner wall 113 of the accommodation hole 112, but the present disclosure is not limited thereto. In other embodiments, the encapsulation 123 can also be in the form of cylinder or other polygonal prisms.

In the first embodiment of the present disclosure, the inner wall 113 of the accommodation hole 112 is, for instance, a smooth surface, so as to receiving light L1 from the light-emitting unit 120, but the present disclosure is not limited thereto. In other embodiments of the present disclosure, the inner wall 113 of the accommodation hole 112 can be adjusted to a rough surface or a surface with microstructure.

Please refer to both FIG. 1C and FIG. 1E, which is the schematic partial magnified view drawn according to area V3 in FIG. 1C. To be explicit, in the second lens 110 of the embodiment of the present disclosure, the first structure 115 is disposed on the light-emitting surface 114, and is used to adjust the light transmission and reflection characteristics of the light-emitting surface 114. For instance, the first structure 115 can reflect part of light L1 from the light-emitting unit 120 which directly came from the accommodation hole 112, and the first structure 115 can also allow the other part of light L2, which is reflected by the bottom surface 116, to penetrate, but the present disclosure is not limited thereto.

For instance, the light-emitting device 100 of the embodiment of the present disclosure can substantially provide light from the light-emitting surface 114, and, in the second lens 110, the first structure 115 can reflect directly part of the light L1 from the accommodation hole 112 (that is, the light L1 transmitted to the light-emitting surface 114 with a greater incident angle), so that luminance of the area of the light-emitting surface 114 adjacent to the accommodation hole 112 will not be too bright.

Figure 1B:
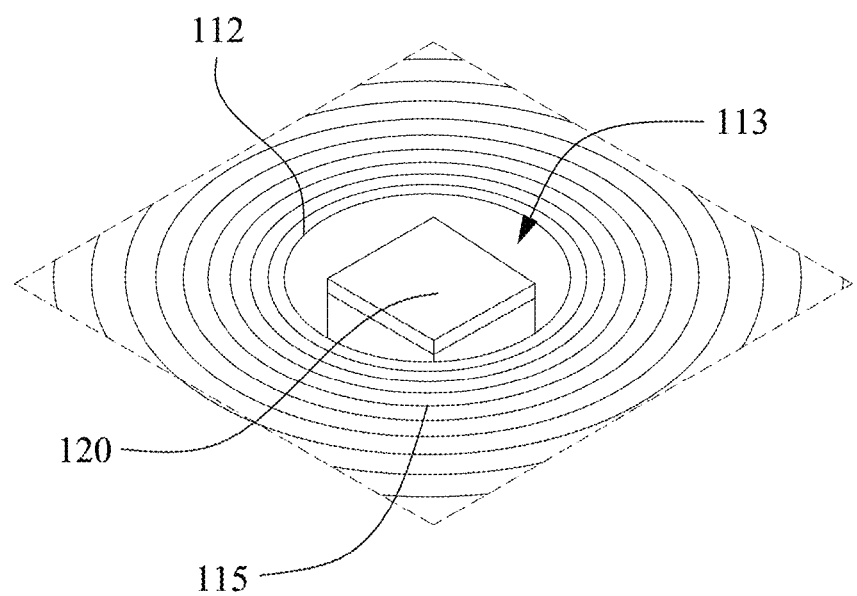
FIG. 1B is schematic partial magnified view according to area V1 of FIG. 1A.

Another example, please refer to FIG. 1B, in the first embodiment of the present disclosure, the first structure 115 can be in the form of a concentric structure on the light-emitting surface 114 by machining, but the present disclosure is not limited thereto. In other embodiments, the first structure on the light-emitting surface can further include irregularly distributed laser dots, regularly distributed laser dots or microstructures arranged along one direction. Please note that, in order to indicate clearly the position and relative relationship of each component, the lines of the partial structure are omitted in FIG. 1A and the figures referred by the following embodiments, and are merely shown in partial magnified views, and are not intended to limit the present disclosure. Person having ordinary skill in the art can configure the first structure 115 at an appropriate position on the light-emitting surface 114 of the second lens 110 to meet the needs.

Please refer to both FIG. 1C and FIG. 1F, and FIG. 1F is the schematic partial magnified view taken from area V4 of FIG. 1C. On the other hand, in the first embodiment of the present disclosure, the second lens 110 further includes second structure 117. To be specified, in the second lens 110 of the embodiment of the present disclosure, the second structure 117 is disposed on the bottom surface 116, so as to reflect the light transmitting in the second lens 110.

For instance, in the light entering from the accommodation hole 112, a part of the light (L2, for example) is reflected by the second structure 117 of the bottom surface 116 and the first structure 115 of the light-emitting surface 114, so that the light L2 can be emitted from the light-emitting surface 114 after transmitting in the second lens 110. The position where the light-emitting surface 114 emitting the light L2 can be allocated away from the accommodation hole 112, so that the intensity of the light provided from light-emitting surface 114 of the light-emitting device 100 can be uniform. The bottom surface of the second lens of the embodiment of the present disclosure is not limited to the bottom surface 116 including the second structures 117, in other embodiments of the present disclosure, the bottom surface 116 can also include reflection layer or reflection coating.

In the embodiment of the present disclosure, the light-emitting unit and the second lens have proper optical coupling effect. To be explicit, please refer to FIG. 1D, the light-emitting unit 120 has a top surface 125, and the top surface 125 is located at a height h1 corresponded to the bottom surface 116 of the second lens 110. Please refer to FIG. 1C, the second lens 110 has a thickness h2, and the ratio of the height h1 to the thickness h2 is in a range from 0.5 to 1, allowing the light-emitting unit 120 and the second lens 110 to have proper optical coupling effect via the accommodation hole 112. Further, thickness h2 of the second lens 110 of the embodiment can be from 0.3 millimeter (mm) to 1 mm, so is applicable to the thinning display device. The height h1 and thickness h2, for instance, are the height or thickness of each component along the normal direction of the bottom surface 126 of the light-emitting unit 120, but the values and parameters are merely illustrative of the detailed features of the embodiment, the present disclosure is not limited thereto.

As seen from the above, the light-emitting device 100 provided by the first embodiment of the present disclosure can reduce the overall thickness, and enhance the light coupling so as to provide effective light-emitting.

On the other hand, the light-emitting device provided by the embodiment of the present disclosure can further provide an efficient manufacturing method of the light-emitting module. Please refer to FIG. 2A, which is the top view of the light-emitting module of the first embodiment of the present disclosure. In the first embodiment of the present disclosure, the light-emitting module 1000 can include the light-emitting devices 100 (6, for example), each light-emitting device 100 includes second lens 110 and the light-emitting unit 120, and light-emitting surfaces 114 of the second lenses 110 are substantially coplanar.

For instance, in the first embodiment of the present disclosure, the light-emitting surface 114 of the second lenses 110 are substantially arranged along a reference plane P1, and the contours of the cross-sections of the second lenses 110 parallel to the reference plane P1 are all quadrangular. The reference plane P1 is substantially parallel to the plane set up by the light-emitting unit 120. In the embodiment of the present disclosure, by arranging one of the side surfaces 118 of each of the light-emitting devices 100 adjacent to one of the side surfaces 118 of another adjacent light-emitting device 100, the light-emitting devices 100 in the light-emitting module 1000 can high provide high distribution density.

Please note that, in the embodiment of the present disclosure, the contour of the section of the second lens parallel to the reference plane P1 is not limited to the quadrangular, and in other embodiments, it may be triangular or polygonal, and the following will refer to other embodiments to further illustrate.

On the other hand, please refer to FIG. 2A, in the first embodiment of the disclosure, the projection area of the accommodation hole 112 of the second lens 110 on the reference plane P1 has substantially a round or oval contour, and thus has a proper light-receiving efficiency. Furthermore, in the embodiment, the distance between the inner wall of the accommodation hole 112 and the light-emitting unit 120 can be close to 0.05 mm, and thus has a proper light coupling effect.

The light-emitting module of the embodiment of the disclosure is not limited to configure of the light-emitting devices arranged in a direct contact manner. FIG. 2B is the top view of the light-emitting module of other embodiments of the present disclosure. Please refer to FIG. 2B, in other embodiments, the light-emitting module 1000A which similar to the light-emitting module 1000 includes light-emitting devices 100, and the light-emitting devices 100 have light-blocking spaces A1 in between, that is, the light-emitting devices 100 are arrange with gaps between each other. Therefore, by aligning the second lenses 110 of the light-emitting devices 100, the embodiment provides a simple method of assembling the light-emitting module 1000A, and can further define dimming area of each light-emitting device 100 in the light-emitting module 1000A, allowing the light-emitting module 1000A being applied to a backlight module to further provide local dimming function.

Please refer to FIG. 2C, which is the sectional view of backlight module of the first embodiment of the present disclosure. Backlight module 1100 includes the light-emitting module 1000 and optical film 1001. The optical film 1001 is disposed on the light-emitting surfaces 114 of the second lens 110 of the light-emitting devices 100 to receive the light emitted from the light-emitting devices 100.

In the embodiment of the present disclosure, the optical film 1001 is, for instance, diffuser, but the present disclosure is not limited thereto. In other embodiments, the optical film 1001 can be configured with other appropriate optical sheets as needed, and can adjust the number and thickness of the optical film 1001 or other optical sheets as needed.

By the light-emitting devices 100 in the light-emitting module 1000, the backlight module 1100 of the first embodiment of the present disclosure can have short optical distance (OD), that is, the distance between the position of the light-emitting units 120 and the optical film 1001 can be further reduced, thus the backlight module 1100 of the embodiment can be applied to thinning display device. Furthermore, since the light-emitting devices 100 has proper light coupling effect, the backlight module 1100 can provide proper backlight with efficiency, and can further control the local dimming function with the light-emitting devices 100.

The light-emitting device in the embodiment provided by the present disclosure can further adjust the light-emitting distribution. Please refer to FIG. 3A, which is a schematic perspective view of the light-emitting device of the second embodiment. Light-emitting device 200 of the second embodiment of the present disclosure is similar to the light-emitting device 100 of the first embodiment, and includes second lens 210 and light-emitting unit 220. The second lens 210 includes light-emitting surface 214, bottom surface 216 and side surfaces 218, and the second lens 210 further includes the accommodation hole (not illustrated in FIG. 3A) passing through the second lens 210. In the embodiment of present disclosure, the light-emitting device 200 further includes second shading layer 230 disposed on part of light-emitting unit 220 and part of second lens 210.

Figure 3A:
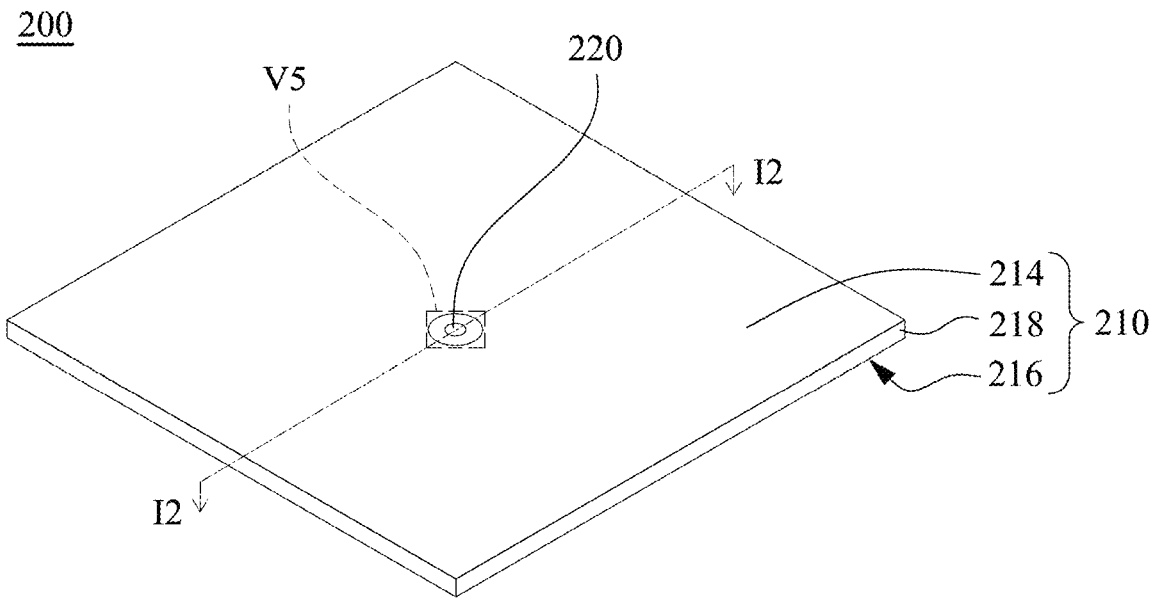
FIG. 3A is the schematic perspective view of light-emitting device of the second embodiment of the present disclosure.
Figure 3B:
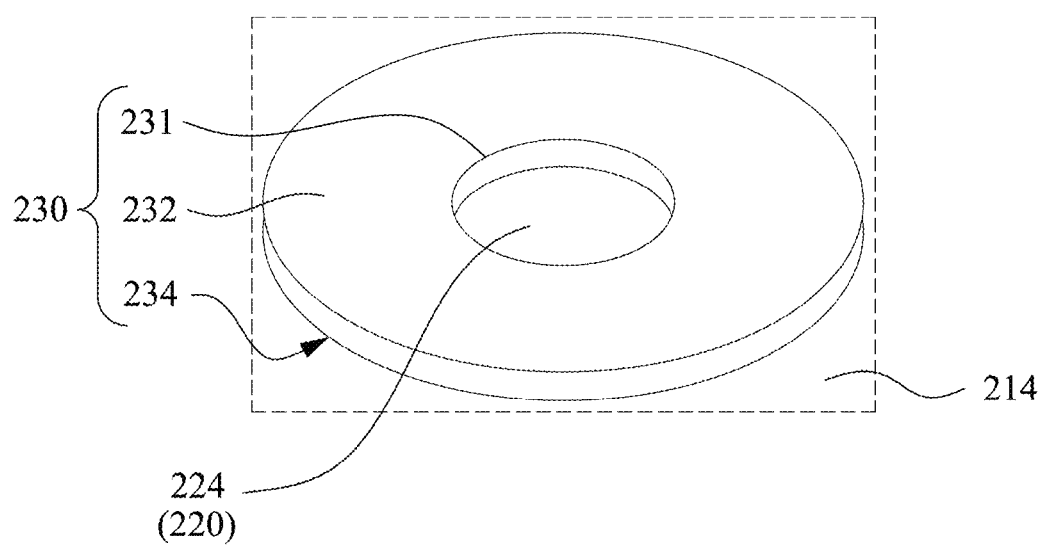
FIG. 3B is the schematic partial magnified view draw according to area V5 of FIG. 3A.

Please refer to FIG. 3B, which is the schematic partial magnified view according to area V5 in FIG. 3A. The second shading layer 230 of the embodiment of the present disclosure is disposed on the first shading layer 224 of the light-emitting unit 220 and the light-emitting surface 214 of the second lens 210. To be specific, the distribution area of the second shading layer 230 located around the first shading layer 224 of the light-emitting unit 220 and the part of the light-emitting surface 214 near the light-emitting unit 220. In the embodiment of the present disclosure, the position of the second shading layer 230 corresponding to the first shading layer 224 has an opening 231 revealing part of the first shading layer 224. Since the second shading layer 230 can cover the area between the light-emitting unit 220 and the accommodation hole (not illustrated in FIG. 3A) of the second lens 210, the light intensity of the area can further be reduced, so as to maintain the uniformity of light-emitting effect, but the present disclosure is not limited thereto. In other embodiments, the second shading layer 230 may not have an opening 231, and achieve uniform light-emitting effect of the light-emitting device 200 by adjusting the transmittance and reflectivity of the entire or partial position of the second shading layer 230.

Figure 3C:
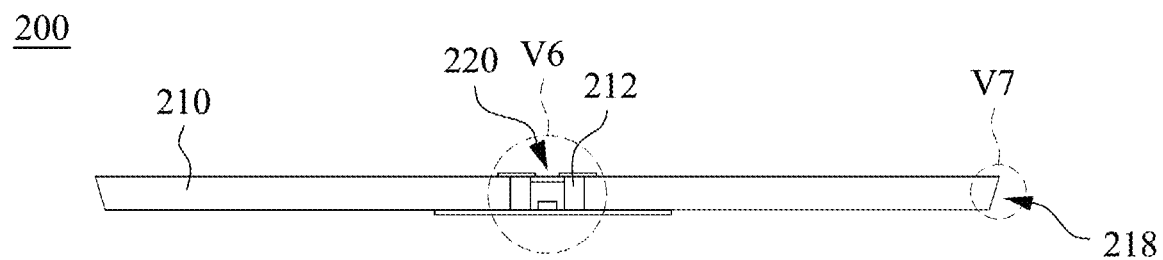
FIG. 3C is the schematic sectional view according to cutting-plane line 12 of FIG. 3A.
Figure 3D:
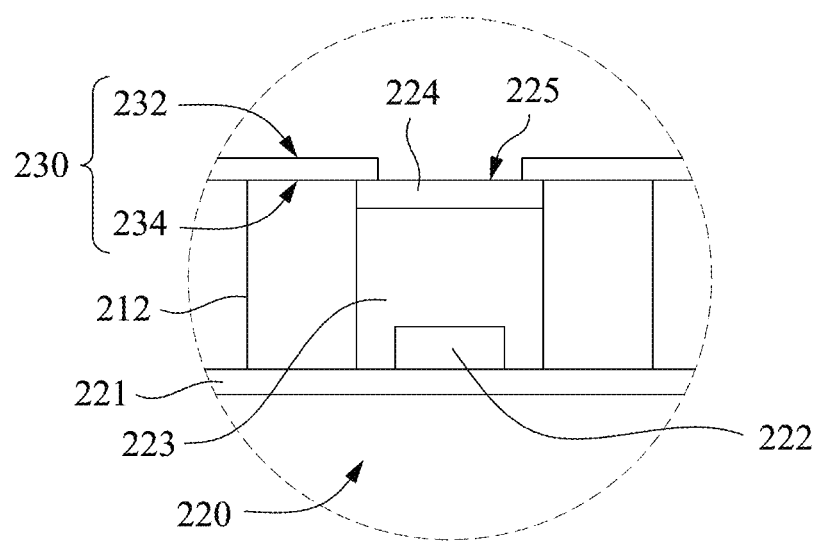
FIG. 3D is the schematic partial magnified view according to area V6 of FIG. 3C.

Please refer to both FIG. 3C and FIG. 3D. FIG. 3C is the sectional view of the embodiment of the present disclosure taken along the cutting-plane line 12 in FIG. 3A, and FIG. 3D is the schematic partial magnified view according to area V6 in FIG. 3C. The second shading layer 230 includes a light-absorbing surface 232 and a reflection surface 234, and the light-absorbing surface 232 is facing away from the light-emitting unit 220, and the reflection surface 234 is facing the light-emitting unit 220. To be specific, light-absorbing surface 232 has, for instance, black surface; reflection surface 234 has, for instance, white surface, and the second shading layer 230 is disposed on the second lens 210 and light-emitting unit 220 by means of, for example, adherence, but the present disclosure is not limited thereto. In other embodiments, the reflection surface 234 may have gray surface. In some embodiments, the reflection surface 234 can have micro-dots, or adjustment patterns occupying a ratio of the surface.

In the embodiment of the present disclosure, the light-emitting unit 220 is disposed in the accommodation hole 212, and the light-emitting unit 220 includes substrate 221, light-emitting chip 222, encapsulation 223 and first shading layer 224. The light-emitting chip 222 is disposed on the substrate 221, and the encapsulation 223 is connecting the first shading layer 224 and the light-emitting chip 222, and the encapsulation 223 substantially surrounds the periphery and the top surface of the light-emitting chip 222. The second shading layer 230 is disposed on the first shading layer 224, and the reflection surface 234 of the second shading layer 230 faces towards top surface 225 of the first shading layer 224; the light-absorbing surface 232 faces away from the top surface 225 of the first shading layer 224, further adjusting the light intensity of the adjacent area of the top surface 225.

Figure 3E:
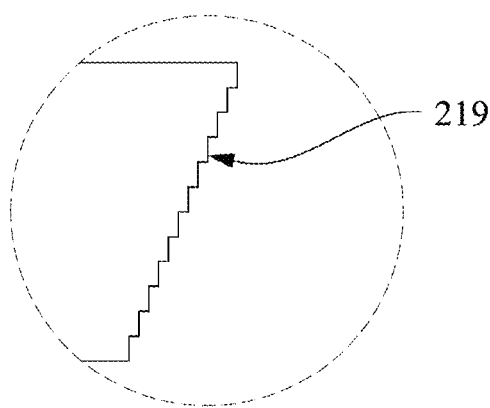
FIG. 3E is the schematic partial magnified view according to area V7 of FIG. 3C.

Please refer to both FIG. 3C and FIG. 3E, and FIG. 3E is the schematic partial magnified view according to area V7 in FIG. 3C. On the other hand, in the second embodiment of the present disclosure, the side surface 218 of the second lens 210 further has third light-stopping structures 219. In the embodiment of the present disclosure, the third light-stopping structures 219, for example, includes microstructures gradually approaching the center of the second lens 210, but the present disclosure is not limited thereto. In other embodiments, the third light-stopping structure 219 can also be slant structure or other microstructures suitable for stopping the light from emitting through the side surface 218.

Please note that, in other embodiments of the present disclosure, the disposition of the third light-stopping structure 219 and the second shading layer 230 are not limited to simultaneously present. In other embodiments, the second lens can further adjust the disposition of the second shading layer as needed, and the third light-stopping structure of the partial area or the entire area may be disposed on the side surface as needed.

In the embodiment of the present disclosure, illumination area of the light-emitting device is not limited to the adjustment of the third light-stopping structures 219. Please refer FIG. 4A, which is the schematic perspective view according to the light-emitting device of the third embodiment of the present disclosure. On the other hand, in the third embodiment of the present disclosure, light-emitting device 300 includes second lens 310 and light-emitting unit 320 disposed in accommodation hole 312 of the second lens 310, and the second lens 310 includes first light-stopping structures 319. The first light-stopping structures 319 are respectively disposed to side surfaces 318 of the second lens 310.

The second lens 310 of the embodiment of the present disclosure includes light-emitting surface 314 and bottom surface 316 disposed opposite to each other and side surfaces 318 respectively connected the light-emitting surface 314 and the bottom surface 316. In the second lens 310 of the embodiment, first light-stopping structure 319 of each side surfaces 318 has indentation 3198, the indentation 3198 is, for instance, in between protrusions 319A. The first light-stopping structure 319 is suitable for preventing the light transmission between the second lens 310 and the second lens 210 of another light-emitting device 300 through the side surface 318.

In other words, the first light-stopping structure 319 in periphery of the second lens 310 of the embodiment of the present disclosure forms, for instance, tooth structure, and top land (which is the top surface of protrusion 319A) of the tooth structure is suitable to be in contact with top land of the tooth structure of the second lens 310 of another light-emitting device 300, allowing the slots (which is the indentation 3198) of the two second lenses 310 to form at least a space.

To be specific, as the second lens 310 and another second lens 310 of the embodiment of the present disclosure are in direct contact with each other, an air gap is formed to prevent light transmission between the second lenses 310 via side surfaces 318, so as to provide a proper local dimming effect in a backlight module.

In other words, when the second lens 310 of the embodiment of the preset disclosure combines with the second lens 310 of another light-emitting device 300, part of the side surface 318 will be in direct contact by the first light-stopping structure 319, and the illumination area of each light-emitting device 300 can further be controlled with the gap formed by the first light-stopping structure 319. Please note that, the embodiment of the present disclosure is not limited to the number of protrusions 319A in the first light-stopping structure 319. In other embodiments, the first light-stopping structure 319 can include more protrusions 319A and indentations 319B between the protrusions 319A.

Please refer to FIG. 4B, which is the top view of the light-emitting module in the third embodiment of the present disclosure. In the third embodiment of the present disclosure, light-emitting module 3000 includes the light-emitting devices 300 (six, for instance), and each light-emitting device 300 includes the second lens 310 and the light-emitting unit 320, and the light-emitting surfaces 314 of the second lenses 310 are substantially coplanar.

In the embodiment of the present disclosure, the first light-stopping structure 319 is disposed on the side surface 318, and between each of the two adjacent second lens 310, the first light-stopping structures 319 form a light-blocking space A2, so as to control the illumination area of every light-emitting device 300 in the light-emitting module 3000, allowing the backlight module applied with the light-emitting module 3000 to provide a proper local dimming function.

For instance, in the light-emitting module 3000 of the embodiment of the present disclosure, the indenting depth w of the indentations 319B of the first light-stopping structures 319 in the second lens 310 of the light-emitting device 300 from the side surface 318 of the second lens 310 is substantially between 0.5 mm to 1 mm, so as to provide proper light controlling effect, but the present disclosure is not limited thereto. In the embodiment, the second lenses 310 are assembled after manufactured individually, but the present disclosure is not limited thereto. In other embodiments, the second lenses 310 can be formed into one piece, while the second lenses 310 are connected to each other, so that the assembling step of every second lenses 310 can be skipped.

In the embodiment of the present disclosure, the number of the accommodation hole of the second lens is not limited to the number of the accommodation hole of the second lens in the above embodiment. Please refer to FIG. 4C, which is the top view of the light-emitting device in the fourth embodiment of the present disclosure. In the fourth embodiment of the present disclosure, light-emitting device 400 includes second lens 410, which has accommodation holes 412. The light-emitting device 400 further includes light-emitting units 420, and each light-emitting unit 420 is accommodated in one of the accommodation holes 412 respectively. In other words, the second lens 410 of the embodiment can simultaneously determine (take 6 for example here) the position of the light-emitting units 420, providing a more efficient way of assembling.

On the other hand, the light-emitting device 400 of the embodiment of the present disclosure further includes first light-stopping structures 419A, which are disposed on side surfaces 418 of the second lens 410, for reducing light transmission from the side surface 418 of the second lens 410.

The light-emitting device 400 can further control the illumination area of the light-emitting units 420 individually. Please refer to FIG. 4C, in the embodiment of the present disclosure; the second lens 410 further includes second light-stopping structures 419B. The second light-stopping structures 419B are respectively disposed between the accommodation holes 412, and the second light-stopping structure 419B passes through the second lens 410. For instance, the second light-stopping structure 419B has second light-stopping surface 419BS, which connects to the light-emitting surface 414 and the bottom surface (not drawn in Fig. C) of the second lens 410. In other words, the second light-stopping structure 419B is similar to the accommodation hole 412 and passes through the second lens 410 to control the transmittance path of the light between the light-emitting units 420, so as to provide proper local dimming effect in the light-emitting device 400.

The second light-stopping structure of the embodiment of the present disclosure is not limited to the second light-stopping structure 419B. To be specific, in fourth embodiment of the present disclosure, in the space formed by the second light-stopping structure 419B is substantially air, but the embodiment of the present disclosure can further fill the space formed by the second light-stopping structure 419B with other materials. Please refer to FIG. 4D, which is the top view of light-emitting device of other embodiments of the present disclosure. In the embodiment, second lens 410A of light-emitting device 400A, like the second lens 410, includes the first light-stopping structure 419A disposed on the side surface 418. Second light-stopping structure 419C of the light-emitting device 400A of the embodiment substantially further accommodates light-stopping material 50, and the light-stopping material 50 is, for instance, white material or black material, but the present disclosure is limited thereto. In short, the light-emitting device 400A of the embodiment can make use of the light-stopping material 50 with different light-absorbing or reflecting effect as needed to further adjust the light-emitting effect of each light-emitting unit 420 in the light-emitting device 400A.

Figure 5A:
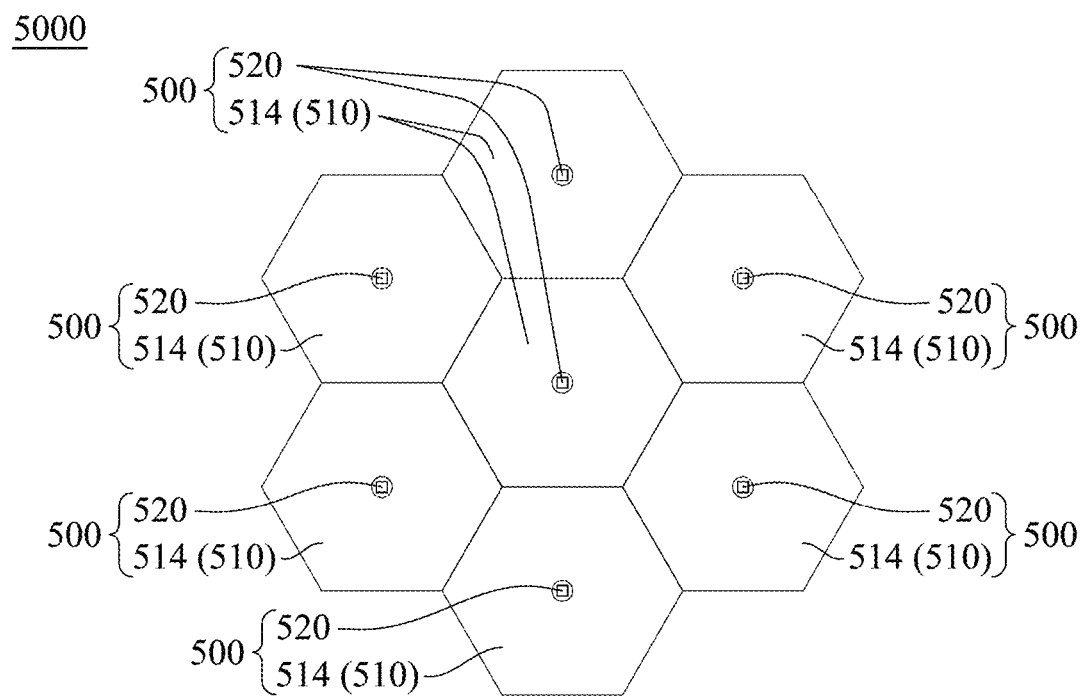
FIG. 5A is the top view of light-emitting module in the fifth embodiment of the present disclosure.

As aforementioned, the light-emitting device of the embodiment of the present disclosure may have a quadrangular contour in a projection area parallel to a plane disposed by the light-emitting unit, but the present disclosure is not limited thereto. Please refer to FIG. 5A, which is the top view of light-emitting module in fifth embodiment of the present disclosure. In the fifth embodiment of the present disclosure, light-emitting module 5000 includes a plurality of light-emitting device 500 (take 7 for instance here). Each light-emitting device 500 includes second lens 510 and light-emitting unit 520, and the second lens 510 has a hexagonal contour in the projection area of the plane disposed by the light-emitting unit 520, meaning that the projection area on the plane where light-emitting surface 514 is on has a hexagonal contour. By the second lens 510 of the embodiment, the light-emitting module 5000 can provide illumination of hexagonal or round area, so as to be applied to different types of display devices. Furthermore, by the direct contact in between the second lenses 510, the light-emitting device 500 also provides an easy method of assembling the light-emitting module 5000.

Figure 5B:
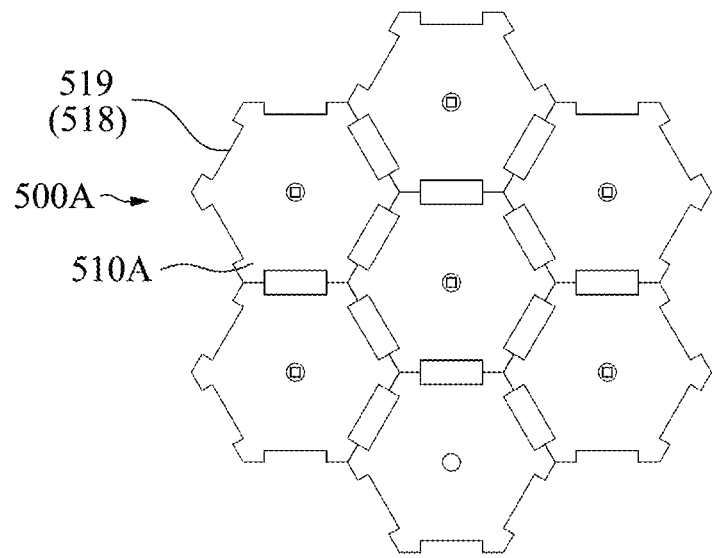
FIG. 5B is the top view of light-emitting module in other embodiments of the present disclosure.

Please refer to FIG. 5B, which is the top view of light-emitting module of other embodiments of the present disclosure. In other embodiments of the present disclosure, like the fifth embodiment, each second lens 510A in light-emitting module 5000A can further have first light-stopping structure 519 formed on side surface 518, allowing light-emitting devices 500A in the light-emitting module 5000A to provide a proper local dimming effect.

Figure 6A:
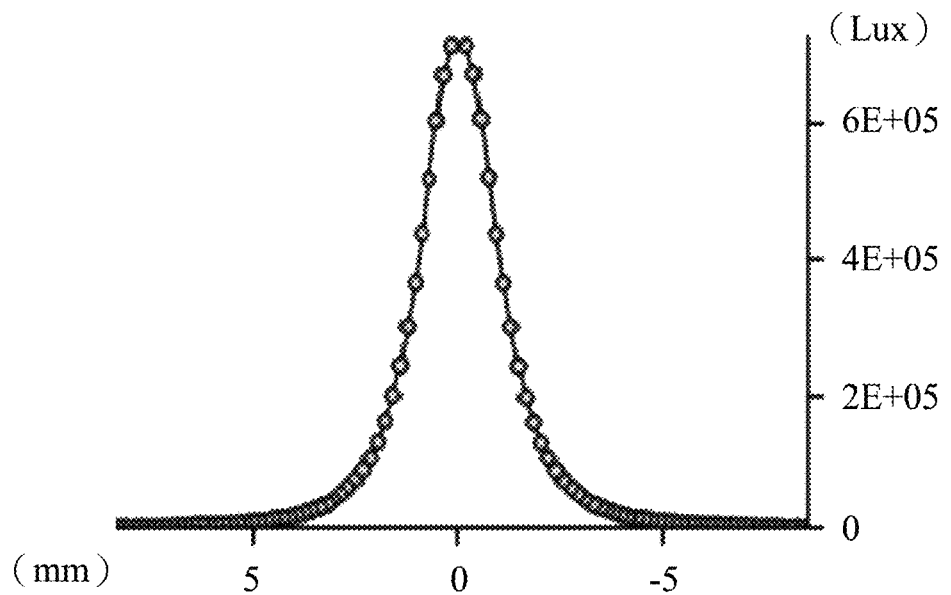
FIG. 6A and FIG. 6B is luminance distribution charts of light-emitting modules of comparative examples.
Figure 6B:
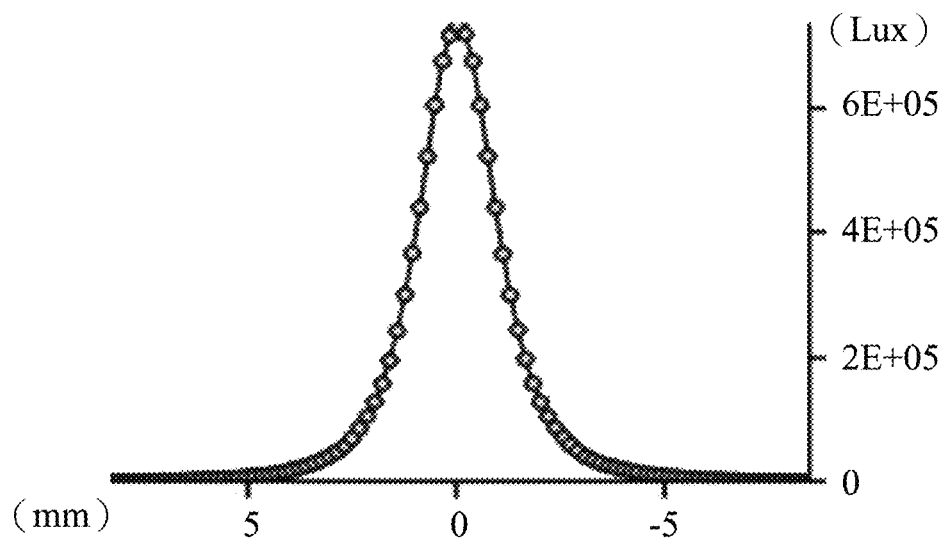
Figure 6C:
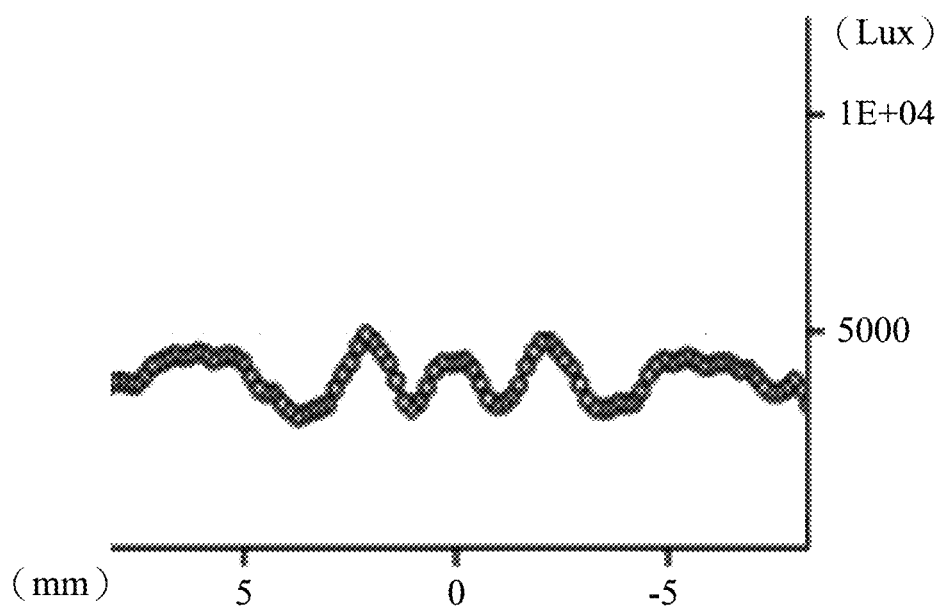
FIG. 6C and FIG. 6D is luminance distribution charts of light-emitting devices of the first embodiment of the present disclosure.
Figure 6D:
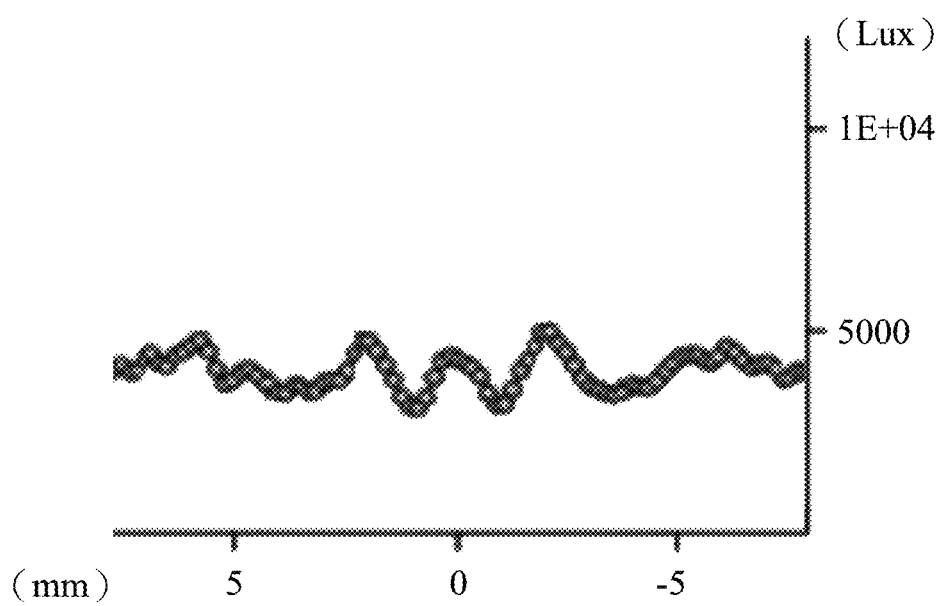

FIG. 6A and FIG. 6B is a luminance distribution chart of the light-emitting module of a comparative example, and FIG. 6A is the luminance distribution chart in the vertical direction when front viewing the light-emitting unit, and FIG. 6B is the luminance distribution chart in the horizontal direction when front viewing the light-emitting unit, and the horizontal axis is mm; the vertical axis is Lux. FIG. 6C and FIG. 6D is luminance distribution chart of light-emitting device of the first embodiment of the present disclosure, and FIG. 6C is the luminance distribution chart in the vertical direction when front viewing the light-emitting unit; FIG. 6D is the luminance distribution chart in the horizontal direction when front viewing the light-emitting unit, and the horizontal axis is mm; the vertical axis is Lux. Comparing FIG. 6A to FIG. 6C and FIG. 6B to FIG. 6D, it is understood that the light-emitting device 100 of the first embodiment of the present disclosure can not only reduce the thickness but also provide a uniform luminance distribution.

In conclusion, the light-emitting device of the embodiment of the present disclosure can provide an illumination effect with a good luminance distribution while reducing the overall thickness by the second lens and the light-emitting unit disposed in the accommodating hole, and the proper light coupling can provide efficient illumination. The light-emitting module of the embodiment of the present disclosure can provide a uniform illumination effect. Since the light-emitting module is included in the backlight module proposed by the embodiment of the present disclosure, the overall thickness of the backlight module can be reduced and a proper surface light source can be provided as well.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A light-emitting device comprising:
   a second lens having a light-emitting surface, a bottom surface, a plurality of side surfaces, and an accommodation hole, wherein the bottom surface is corresponded to the light-emitting surface, and the side surfaces connect the light-emitting surface and the bottom surface, and the accommodation hole passes through the second lens;
   a light-emitting unit, wherein the accommodation hole accommodates the light-emitting unit, and the light-emitting unit has a light-emitting chip, an encapsulation covering the light-emitting chip, and a first shading layer disposed on the encapsulation; and
   a second shading layer disposed on the first shading layer and the light-emitting surface, the second shading layer having an opening corresponding to a position of the first shading layer, and the opening of the second shading layer corresponding to part of the first shading layer.

2. The light-emitting device as claim 1, wherein the second shading layer has a reflective surface and a light-absorbing surface, and the reflective surface is facing toward the light-emitting unit, and the light-absorbing surface is facing away from the light-emitting unit.

3. The light-emitting device as claim 1, wherein a surface of an inner wall of the accommodation hole is a smooth surface or a rough surface.

4. The light-emitting device as claim 1, wherein the second lens has first structure being disposed on the light-emitting surface.

5. The light-emitting device as claim 1, wherein the second lens has second structure being disposed on the bottom surface.

6. The light-emitting device as claim 1, wherein the second lens has a plurality of first light-stopping structures being deposed on the side surfaces of the second lens, and each of the first light-stopping structures has at least one indentation on one of the side surfaces, and the indentation is depressed toward the accommodation hole.

7. The light-emitting device as claim 1, wherein the second lens has a plurality of the accommodation holes, and the second lens has a plurality of second light-stopping structures, and the second light-stopping structures are respectively disposed between the accommodation holes, and the second light-stopping structures pass through the second lens.

8. The light-emitting device as claim 7, wherein at least one of the side surfaces of the second lens has a third light-stopping structure.

9. The light-emitting device as claim 1, wherein the light-emitting unit has a top surface, and the top surface is located at a height corresponded to the bottom surface of the second lens, and the second lens has a thickness, and ratio of the height to the thickness is from 0.5 to 1.

10. A light-emitting module, comprising:
    a plurality of light-emitting devices disposed in a coplanar manner,
    wherein each of the light-emitting devices comprises:
    a second lens having a light-emitting surface, a bottom surface, a plurality of side surfaces, and an accommodation hole, wherein the bottom surface is corresponded to the light-emitting surface, and the side surfaces connect the light-emitting surface and the bottom surface, and the accommodation hole passes through the second lens; and
    a light-emitting unit, wherein the accommodation hole accommodates the light-emitting unit, and the light-emitting unit has a light-emitting chip, an encapsulation covering the light-emitting chip, and a first shading layer disposed on the encapsulation; and
    a second shading layer disposed on the first shading layer and the light-emitting surface, the second shading layer having an opening corresponding to a position of the first shading layer, and the opening of the second shading layer corresponding to part of the first shading layer.

11. The light-emitting module as claim 10, wherein each of the side surfaces of each of the light-emitting devices makes direct contact with one of the side surfaces of another one of the light-emitting devices located nearby.

12. A backlight module, comprising:
    the light-emitting module as claim 10; and
    an optical film being disposed on the light-emitting surfaces of the second lenses of the light-emitting unit,
    wherein the optical film is configured to receive illumination light provided by the light-emitting devices.

13. A light-emitting device comprising:
    a second lens having a light-emitting surface, a bottom surface, a plurality of side surfaces, and an accommodation hole, wherein the bottom surface is corresponded to the light-emitting surface, and the side surfaces connect the light-emitting surface and the bottom surface, and the accommodation hole passes through the second lens;
    a light-emitting unit, wherein the accommodation hole accommodates the light-emitting unit, and the light-emitting unit has a light-emitting chip, an encapsulation covering the light-emitting chip, and a first shading layer disposed on the encapsulation; and
    a second shading layer disposed on the first shading layer and the light-emitting surface, the second shading layer having a reflective surface and a light-absorbing surface, the reflective surface facing toward the light-emitting unit, and the light-absorbing surface facing away from the light-emitting unit.

14. A light-emitting module, comprising:
    a plurality of light-emitting devices disposed in a coplanar manner,
    wherein each of the light-emitting devices comprises:
    a second lens having a light-emitting surface, a bottom surface, a plurality of side surfaces, and an accommodation hole, wherein the bottom surface is corresponded to the light-emitting surface, and the side surfaces connect the light-emitting surface and the bottom surface, and the accommodation hole passes through the second lens;

a light-emitting unit, wherein the accommodation hole accommodates the light-emitting unit, and the light-emitting unit has a light-emitting chip, an encapsulation covering the light-emitting chip, and a first shading layer disposed on the encapsulation; and a second shading layer disposed on the first shading layer and the light-emitting surface, the second shading layer having a reflective surface and a light-absorbing surface, the reflective surface facing toward the light-emitting unit, and the light-absorbing surface facing away from the light-emitting unit.

* * * * *